(12) United States Patent
Chen et al.

(10) Patent No.: US 11,181,705 B2
(45) Date of Patent: Nov. 23, 2021

(54) OPTICAL MODULE

(71) Applicant: InnoLight Technology (Suzhou) LTD., Jiangsu (CN)

(72) Inventors: Long Chen, Jiangsu (CN); Yuzhou Sun, Jiangsu (CN); Xiongfei Zhai, Jiangsu (CN); Donghan Wang, Jiangsu (CN); Zhenzhong Wang, Jiangsu (CN); Meng Fang, Jiangsu (CN); Chao Zhang, Jiangsu (CN); Xigui Fang, Jiangsu (CN); Xiangzhong Wang, Jiangsu (CN)

(73) Assignee: InnoLight Technology (Suzhou) Ltd., Suzhou (CN)

( * ) Notice: Subject to any disclaimer, the term of this patent is extended or adjusted under 35 U.S.C. 154(b) by 308 days.

(21) Appl. No.: 16/227,691

(22) Filed: Dec. 20, 2018

(65) Prior Publication Data

US 2019/0204516 A1    Jul. 4, 2019

(30) Foreign Application Priority Data

Dec. 30, 2017    (CN) .......................... 201711488535.8

(51) Int. Cl.
  *G02B 6/42*    (2006.01)
  *H05K 1/18*    (2006.01)
  (Continued)

(52) U.S. Cl.
  CPC ......... *G02B 6/4268* (2013.01); *G02B 6/4246* (2013.01); *G02B 6/4281* (2013.01);
  (Continued)

(58) Field of Classification Search
  CPC .. G02B 6/4268; G02B 6/4246; G02B 6/4281; H05K 1/0203; H05K 1/148; H05K 1/181;
  (Continued)

(56) References Cited

U.S. PATENT DOCUMENTS 9,419,717 B2    8/2016 Huang et al.
9,496,959 B1 *  11/2016 Nagarajan ............ G02B 6/4271
(Continued)

FOREIGN PATENT DOCUMENTS

CN    104503044 A    4/2015
CN    104597573 A    5/2015
(Continued)

*Primary Examiner* — Georgia Y Epps
*Assistant Examiner* — Don J Williams
(74) *Attorney, Agent, or Firm* — Finnegan, Henderson, Farabow, Garrett & Dunner, LLP

(57) ABSTRACT

An optical module includes a housing, and a main circuit board, an optical transmitting assembly, an optical receiving assembly, and an electrical connector that are disposed inside the housing. The optical transmitting assembly includes at least two sets of lasers, a transmitting-end optical assembly, and a transmitting-end optical fiber receptacle. The optical receiving assembly includes at least two sets of photoelectric detectors, a receiving-end optical assembly, and a receiving-end optical fiber receptacle. The electrical connector electrically connects the optical transmitting assembly and the optical receiving assembly to the main circuit board.

20 Claims, 2 Drawing Sheets

(51) Int. Cl.
*H05K 7/20* (2006.01)
*H05K 1/14* (2006.01)
*H05K 1/02* (2006.01)

(52) U.S. Cl.
CPC ........... *H05K 1/0203* (2013.01); *H05K 1/148* (2013.01); *H05K 1/181* (2013.01); *H05K 7/2039* (2013.01); *H05K 2201/10121* (2013.01); *H05K 2201/10151* (2013.01)

(58) Field of Classification Search
CPC ....... H05K 7/2039; H05K 2201/10121; H05K 2201/10151
See application file for complete search history.

(56) References Cited

U.S. PATENT DOCUMENTS

| | | |
|---|---|---|
| 2016/0191166 A1 | 6/2016 | Wang et al. |
| 2017/0187462 A1 | 6/2017 | Luo et al. |

FOREIGN PATENT DOCUMENTS

| | | |
|---|---|---|
| CN | 105572816 A | 5/2016 |
| CN | 107045166 A | 8/2017 |

\* cited by examiner

OPTICAL MODULE

CROSS-REFERENCE TO RELATED APPLICATION

This application is based upon and claims priority to Chinese Patent Application 201711488535.8, filed on Dec. 30, 2017, the entire content of which is incorporated herein by reference.

FIELD OF THE DISCLOSURE

The present disclosure relates to the field of optical communication and, more particularly, to an optical module.

BACKGROUND

With the rapid development of optical communication and the Internet in recent years, users' demands for the network have also sharply increased, resulting in a surge of traffic in telecommunication trunk networks, with traffic increasing at a rate of 50% to 80% each year. In order to adapt to the fast development of the network market, the transmission speed of optical modules has also been rapidly increasing, and now 100 G, 200 G, and even 400 G optical modules have appeared. The increase in the speed of optical modules poses significant problems such as heat dissipation and miniaturization. The need to have more optical components laid out inside a smaller optical module housing while dealing with the problem of heat dissipation has become a challenge in the industry.

Chinese patent No. 201420189088.1 discloses a replaceable optical transmitting module and an optical transceiver having the same. The optical transmitting module contains a plurality of individually and independently disposed optical subassemblies, and at least one positioning mount disposed on the optical transceiver. This type of optical transmitting module is not able to accommodate more components because the quantity of lasers, chips, and optical assemblies that can be accommodated is limited by the optical subassemblies and layout. Additionally, this type of optical transmitting module has poor heat dissipation and is difficult to assemble.

SUMMARY

One embodiment of the present disclosure provides an optical module. The optical module includes a housing. The optical module also includes a main circuit board, an optical transmitting assembly, an optical receiving assembly, and an electrical connector that are disposed inside the housing. The optical transmitting assembly includes at least two sets of lasers, a transmitting-end optical assembly, and a transmitting-end optical fiber receptacle. The at least two sets of lasers are arranged in a stacked manner on planes parallel to the plane on which the main circuit board is located. The transmitting-end optical assembly orients light emitted from the at least two sets of lasers toward the transmitting-end optical fiber receptacle. The optical receiving assembly includes at least two sets of photoelectric detectors, a receiving-end optical assembly, and a receiving-end optical fiber receptacle. The at least two sets of photoelectric detectors are arranged in a stacked manner on planes parallel to the plane on which the main circuit board is located. The receiving-end optical assembly orients light from the receiving-end optical fiber receptacle toward the at least two sets of photoelectric detectors. The electrical connector electrically connects the optical transmitting assembly and optical receiving assembly to the main circuit board.

Another embodiment of the present disclosure provides an optical module. The optical module includes a housing. The optical module also includes a main circuit board, an optical transmitting assembly, an optical receiving assembly, and an electrical connector that are disposed inside the housing. The optical transmitting assembly includes at least two sets of lasers, a transmitting-end substrate, a transmitting-end optical assembly, and a transmitting-end optical fiber receptacle. The at least two sets of lasers are disposed on the transmitting-end substrate. The transmitting-end optical assembly orients light emitted from the at least two sets of lasers toward the transmitting-end optical fiber receptacle. The transmitting-end substrates and the transmitting-end optical fiber receptacle are fixed together. The optical receiving assembly includes at least two sets of photoelectric detectors, a receiving-end substrate, a receiving-end optical assembly, and a receiving-end optical fiber receptacle. The at least two sets of photoelectric detectors are disposed on the receiving-end substrate. The receiving-end optical assembly orients light from the receiving-end optical fiber receptacle toward the at least two sets of photoelectric detectors. The receiving-end substrate and the receiving-end optical fiber receptacle are fixed together. The electrical connector electrically connects the optical transmitting assembly and optical receiving assembly to the main circuit board.

DETAILED DESCRIPTION

Figure 1:
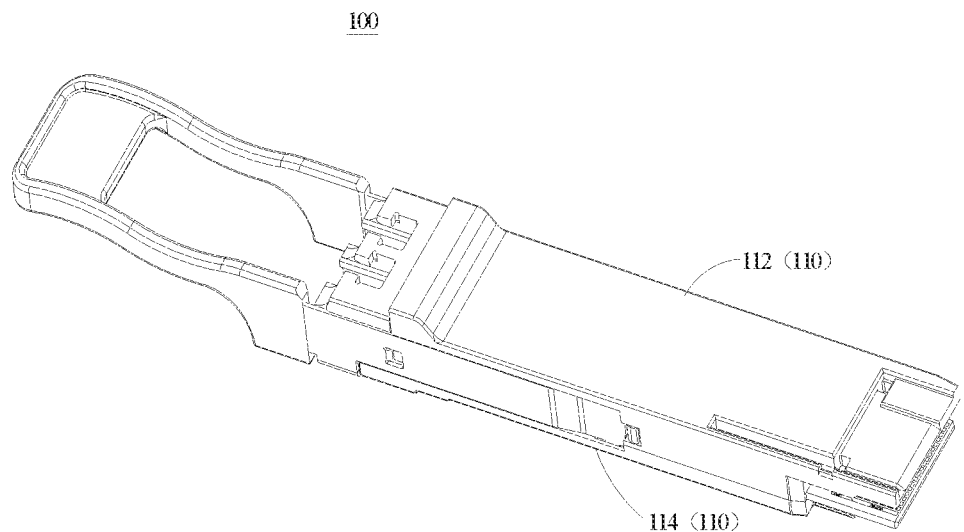
FIG. 1 is a diagram illustrating a perspective view of an optical module in an embodiment of the present disclosure.

The text below provides a detailed description of the present disclosure with reference to specific embodiments illustrated in the attached drawings. However, these embodiments do not limit the present disclosure; the scope of protection for the present disclosure covers changes made to the structure, method, or function by persons having ordinary skill in the art on the basis of these embodiments.

In order to facilitate the presentation of the drawings in the present disclosure, the sizes of certain structures or portions have been enlarged relative to other structures or portions; therefore, the drawings in the present disclosure are only for the purpose of illustrating the basic structure of the subject matter of the present disclosure.

Additionally, terms in the text indicating relative spatial position, such as "upper," "above," "lower," "below," and so forth, are used for explanatory purposes in describing the relationship between a unit or feature depicted in a drawing with another unit or feature therein. Terms indicating relative spatial position may refer to positions other than those depicted in the drawings when a device is being used or operated. For example, if a device shown in a drawing is flipped over, a unit which is described as being located "below" or "under" another unit or feature will be located "above" the other unit or feature. Therefore, the illustrative term "below" may include positions both above and below. A device may be oriented in other ways (rotated 90 degrees or facing another direction), and descriptive terms that appear in the text and are related to space should be interpreted accordingly.

Moreover, it should be understood that although the terms "first," "second," etc. may be used in the text to describe various components or structures, the objects being described should not be limited by the aforementioned terms. The aforementioned terms are only for the purpose of differentiating between the objects being described. For example, a first surface may be referred to as a second surface, and, similarly, a second surface may also be referred to as a first surface; this does not deviate from the scope of protection for the present disclosure.

A purpose of the present disclosure is to provide an optical module that has efficient heat dissipation capacity and a more rational spatial layout.

Figure 2:
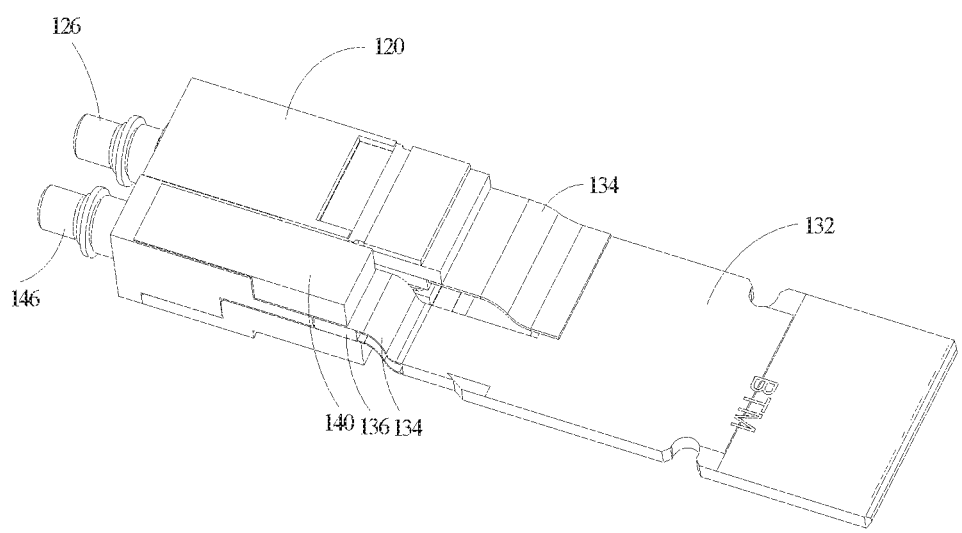
FIG. 2 is a structural diagram illustrating an interior of the optical module in FIG. 1 after its housing is removed.

FIG. 1 is a diagram illustrating a perspective view of an optical module 100 in an exemplary embodiment of the present disclosure. FIG. 2 is a structural diagram illustrating an interior of the optical module 100 in FIG. 1 after its housing is removed. As illustrated in FIG. 1 and FIG. 2, the optical module 100 includes a housing 110. The optical module 100 also includes a main circuit board 132, an optical transmitting assembly 120, an optical receiving assembly 140, and an electrical connector that are disposed inside the housing 110.

The housing 110 includes an upper housing 112 and a lower housing 114. The upper housing 112 and the lower housing 114 are assembled together to accommodate components such as the main circuit board 132, the optical transmitting assembly 120, the optical receiving assembly 140, and the electrical connector. The main circuit board 132 is a rigid circuit board on which electronic components are disposed, such electronic components including a capacitor, a resistor, a processing chip, etc. One end of the main circuit board 132 is connected to the electrical connector, and the other end is a gold finger that is used to provide an external electrical connection. The electrical connector may include a flexible board, i.e., a flexible circuit board. In the embodiment illustrated in the drawings, the electrical connector includes a plurality of flexible connecting boards 134 and a rigid connecting board 136.

Figure 3:
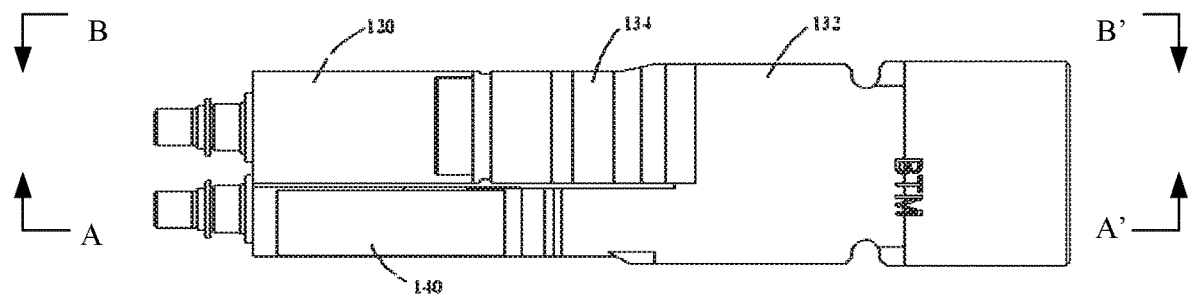
FIG. 3 is a top view of the interior of the optical module illustrated in FIG. 2.
Figure 4:
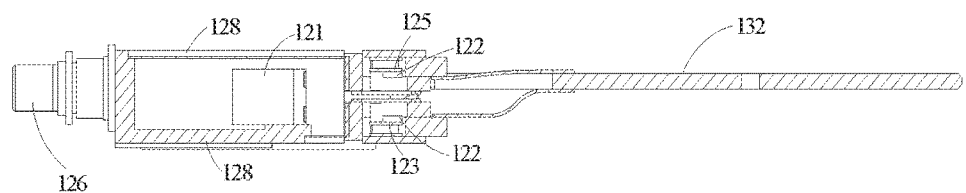
FIG. 4 is a cross-sectional diagram along line B-B' of the optical module illustrated in FIG. 3.

FIG. 3 is a top view of the optical module 100 illustrated in FIG. 2. FIG. 4 is a cross-sectional diagram along line B-B' of the optical module 100 illustrated in FIG. 3. Referring to FIG. 3 and FIG. 4, the optical transmitting assembly 120 of the optical module 100 includes two sets of lasers 122, a transmitting-end substrate (including a first transmitting-end substrate 123 and a second transmitting-end substrate 125), a transmitting-end fixing board 128, a transmitting-end optical assembly 121, and a transmitting-end optical fiber receptacle 126.

In the embodiment illustrated in FIG. 4, there are two sets of lasers, and each set of lasers 122 includes four lasers. In other exemplary embodiments, the number of sets of lasers and the number of lasers in each set may be adjusted as needed. One set of lasers 122 is disposed on the first transmitting-end substrate 123, and the other set of lasers 122 is disposed on the second transmitting-end substrate 125. The two sets of lasers 122 are arranged in a stacked manner on planes parallel to a plane on which the main circuit board 132 is located, i.e., the first transmitting-end substrate 123 and the second transmitting-end substrate 125 are disposed in a stacked manner. The optical transmitting assembly 120 and the optical receiving assembly 140 are arranged side-by-side inside the housing 110. The two sets of lasers 122 are arranged one above the other inside the housing 110. A person with ordinary skill in the art will now understand that between the lasers and the transmitting-end substrates, there may be other mediums for the purpose of achieving better fixing, heat dissipation, etc. For example, a heat dissipating pad, a TEC (thermoelectric cooler), or other components may be arranged between the lasers and the transmitting-end substrates.

The transmitting-end optical assembly 121 is configured to orient light emitted from the two sets of lasers 122 toward the transmitting-end optical fiber receptacle 126. The transmitting-end optical assembly 121 mainly includes optical components such as a prism, a wavelength division multiplexer, a lens, etc. In comparison with a connection made using an optical fiber, the transmitting-end optical assembly 121 does not require an optical fiber receptacle connection, which is inconvenient to assemble, and does not require a greater number of receptacles and separate components that occupy a large amount of internal space in the housing 110. Additionally, in the present embodiment, the transmitting-end optical fiber receptacle 126 is an interface used to connect with an assembly external to the optical module 100.

Further, each transmitting-end substrate has two opposing surfaces. The first transmitting-end substrate 123 is described as an example below. A surface of the first transmitting-end substrate 123 is fitted and fixed on an inner surface of the upper housing 112. In the present embodiment, a good thermal connection between the first transmitting-end substrate 123 and the upper housing 112 may be achieved by means of thermally conductive adhesive or a thermally conductive pad. The other surface of the first transmitting-end substrate 123 is used to fix one set of lasers 122. The second transmitting-end substrate 125 and the first transmitting-end substrate 123 are the same except that one surface of the second transmitting-end substrate 125 is fitted and fixed on an inner surface of the lower housing 114. Thus, the two sets of lasers 122 are disposed opposing one another. The two sets of lasers 122 are relatively close to one another; accordingly, the first transmitting-end substrate 123 and the second transmitting-end substrate 125 are relatively far from one another. Heat produced by the lasers 122 is radiated more easily because the first transmitting-end substrate 123 and the second transmitting-end substrate 125 are both thermally connected to the housing 110. In other exemplary embodiments, the first transmitting-end substrate 123 and the second transmitting-end substrate 125 may also be disposed close together. Still alternatively, the first transmitting-end substrate 123 and the second transmitting-end substrate 125 may be integrated as a single transmitting-end substrate, with the two sets of lasers 122 disposed back-to-back on the two opposing surfaces of the single transmitting-end substrate, respectively. The first transmitting-end substrate 123 and the second transmitting-end substrate 125 may achieve thermal conductivity by means of connections between their side surfaces and the housing 110 or achieve heat dissipation by means of direct connections between the lasers and the housing 110.

Additionally, the optical transmitting assembly 120 further includes the transmitting-end fixing board 128 enclosing the two sets of lasers 122 and the transmitting-end optical assembly 121. The transmitting-end fixing board 128 is fixed to the transmitting-end substrate and the transmitting-end optical fiber receptacle 126. Thus, the lasers 122 and the transmitting-end optical assembly 121 are all enclosed. The optical transmitting assembly 120 thus becomes a convenient-to-assemble unit. The optical transmitting assembly 120 and the housing 110 are connected together by means of thermally conductive adhesive or a thermally conductive pad. The quantity of transmitting-end fixing boards 128, how the transmitting-end fixing boards are fixed together, and which components are enclosed thereby may be adjusted as needed.

Figure 5:
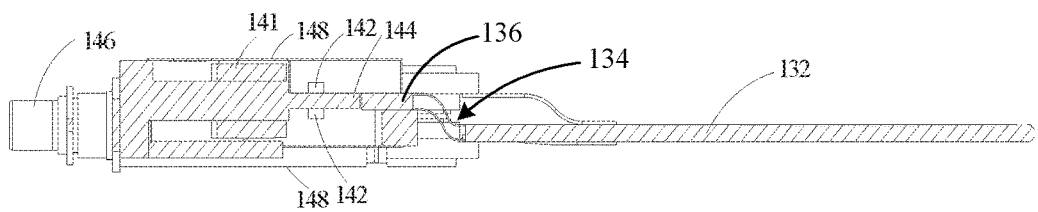
FIG. 5 is a cross-sectional diagram along line A-A' of the optical module illustrated in FIG. 3.

FIG. 5 is a cross-sectional diagram along line A-A' of the optical module 100 illustrated in FIG. 3. Referring to FIG. 3 and FIG. 5, the optical receiving assembly 140 of the optical module 100 includes at least two sets of photoelectric detectors 142, a receiving-end substrate 144, a receiving-end fixing board 148, a receiving-end optical assembly 141, and a receiving-end optical fiber receptacle 146.

In the embodiment illustrated in FIG. 5, there are two sets of photoelectric detectors 142, and each set of photoelectric detectors 142 includes four photoelectric detectors. In other exemplary embodiments, the number of sets of photoelectric detectors and the number of photoelectric detectors in each set may be adjusted as needed. The two sets of photoelectric detectors 142 are disposed on the two opposing surfaces of the receiving-end substrate 144. The two sets of photoelectric detectors 142 are arranged in a stacked manner on planes parallel to the plane on which the main circuit board 132 is located. The optical transmitting assembly 120 and the optical receiving assembly 140 are respectively arranged side-by-side in the housing 110, and the two sets of photoelectric detectors 142 are arranged one above the other inside the housing 110. The receiving-end optical assembly 141 is used to orient light from the receiving-end optical fiber receptacle 146 toward the two sets of photoelectric detectors 142. The receiving-end optical assembly 141 mainly includes optical components such as a prism, a wavelength division multiplexer, a lens, etc. In comparison with a connection made using an optical fiber, the receiving-end optical assembly 141 does not require an optical fiber receptacle connection, which is inconvenient to assemble, and does not require a greater number of receptacles and separate components, which occupy a large amount of internal space in the housing 110. In the present embodiment, the receiving-end optical fiber receptacle 146 is an interface used to connect to an assembly external to the optical module.

The optical receiving assembly 140 further includes the receiving-end fixing board 148 enclosing the two sets of photoelectric detectors 142 and the receiving-end optical assembly 141. The receiving-end fixing board 148 is fixed to the receiving-end substrate 144 and the receiving-end optical fiber receptacle 146. Thus, the photoelectric detectors 142 and the receiving-end optical assembly 141 are all enclosed. The optical receiving assembly 140 thus becomes a convenient-to-assemble unit. The optical receiving assembly 140 and the housing 110 are connected together by means of thermally conductive adhesive or a thermally conductive pad. In the present embodiment, the receiving-end substrate 144 is thermally connected to the housing 110 by means of the receiving-end fixing board 148. Of course, the receiving-end substrate 144 may also be thermally connected to the housing 110 directly through a side of an interior wall of the housing 110 and not by means of the receiving-end fixing board 148. Alternatively, both of the above-described methods for the thermally connecting the receiving-end substrate 144 to the housing 110 may be used. The quantity of receiving-end fixing board 148, how the receiving-end fixing boards are fixed together, and which components are enclosed thereby may be adjusted as needed.

Additionally, in this exemplary embodiment, the electrical connector directly connected between the optical receiving assembly 140 and the main circuit board 132 is a structure combining flexible and rigid boards. Specifically, the electrical connector includes two flexible connecting boards 134 and one rigid connecting board 136. The two flexible connecting boards 134 on the side of the optical receiving assembly 140 are disposed parallel to one another. Each one of the two flexible connecting boards 134 includes a first end and a second end. The first ends of the two flexible connecting boards 134 are connected to the two opposing surfaces of the rigid connecting board 136, respectively. The second ends of the two flexible connecting boards 134 are connected to the two opposing surfaces of the main circuit board 132, respectively. As a result, a rigid-flexible-rigid connection is formed. An electrical connection between the flexible connecting boards 134 and the main circuit board 132 may be achieved by means of soldering. An electrical connection between the flexible connecting boards 134 and the rigid connecting board 136 may be achieved by means of combining flexible and rigid boards. Such connection has the advantage of convenient assembly. An electrical connection between the photoelectric detectors or the lasers (or monitoring photoelectric detectors) and the flexible connecting boards may be achieved by means of gold wires.

In the optical module 100 of the present exemplary embodiment, the optical transmitting assembly 120 and the optical receiving assembly 140 are arranged side-by-side, and the photoelectric detectors 142 and lasers 122 inside the optical transmitting assembly 120 and optical receiving assembly 140 are stacked one above the other. Thus, more optical and electronic components may be arranged in a limited space, thereby making it easier to achieve high-speed transmission. Additionally, since heat dissipation is achieved by means of fixing the photoelectric detectors 142 and the lasers 122 to the substrates (the transmitting-end substrate and the receiving-end substrate) that are thermally connected to the housing, the heat dissipation of the optical module 100 will be effective. Moreover, the substrates and the optical fiber receptacles (the transmitting-end optical fiber receptacle 126 and the receiving-end optical fiber receptacle 146) are fixed together by means of the fixing boards (the transmitting-end fixing board 128 and the receiving-end fixing board 148), thus facilitating optical path coupling and component assembly.

A person with ordinary skill in the art will now understand that the layout of the components in the optical transmitting assembly 120 and the layout of the components in the optical receiving assembly 140 are interchangeable. In other words, the components in the optical transmitting assembly 120 may adopt the layout of the optical receiving assembly 140, and the components in the optical receiving assembly 140 may adopt the layout of the optical transmitting assembly 120. Additionally, the sizes and external shapes of the optical transmitting assembly 120 and the optical receiving assembly 140 may be adjusted as needed, thus enabling the optical transmitting assembly 120 and the optical receiving assembly 140 to be conveniently fixed in the housing 110 and to achieve better heat dissipation, etc. For example, the optical transmitting assembly 120 may have a larger volume, or the shape of the optical transmitting assembly 120 may be a non-cubic shape such as two cubes of different volume or a trapezoidal body, etc. Alternatively, for convenient assembly and fixing, the optical transmitting assembly 120 and the optical receiving assembly 140 may have a click-fit connector that fixes the assemblies together.

With its rational components layout and heat dissipation design, the optical module of the present disclosure may enable the housing of the optical module to accommodate more optical and electronic components. Therefore, key technical challenges to an optical module for high-speed transmission are resolved, making it possible to manufacture high-speed optical modules.

In comparison with currently available technology, the present disclosure provides the following benefits. In the technical solution provided by the present disclosure, an optical transmitting assembly and an optical receiving assembly are assembled together after at least two sets of optoelectronic chips, such as lasers or photoelectric detectors, are arranged on each of the two assemblies. Thus, more components may be arranged in a limited space, thereby achieving a high-density layout and facilitating a faster optical module transmission speed.

It should be understood that despite the descriptions of embodiments in the specification, each embodiment does not entail only one independent technical solution. The specification is written this way simply for the sake of clarity. Persons having ordinary skill in the art should treat the specification as a whole. The technical solutions in the embodiments may be combined in appropriate ways to form other embodiments that may be understood by persons having ordinary skill in the art.

The series of detailed descriptions above is only intended to provide specific descriptions of feasible embodiments of the present disclosure. The detailed descriptions are not to be construed as limiting the scope of protection for the present disclosure; all equivalent embodiments or changes that are not detached from the techniques of the present disclosure in essence should fall under the scope of protection of the present invention.

What is claimed is:

1. An optical module, comprising:
   a housing; and
   a main circuit board, an optical transmitting assembly, an optical receiving assembly, and an electrical connector that are disposed inside the housing,
   wherein
   the optical transmitting assembly comprises at least two sets of lasers, a transmitting-end optical assembly, and a transmitting-end optical fiber receptacle, the at least two sets of lasers being arranged in a stacked manner on planes parallel to a plane on which the main circuit board is located, and the transmitting-end optical assembly orienting light emitted from the at least two sets of lasers toward the transmitting-end optical fiber receptacle,
   the optical receiving assembly comprises at least two sets of photoelectric detectors, a receiving-end optical assembly, and a receiving-end optical fiber receptacle, the at least two sets of photoelectric detectors being arranged in a stacked manner on planes parallel to the plane on which the main circuit board is located, the at least two sets of photoelectric detectors being stacked one above another in a direction perpendicular to the plane on which the main circuit board is located, and the receiving-end optical assembly orienting light from the receiving-end optical fiber receptacle toward the at least two sets of photoelectric detectors, and
   the electrical connector electrically connects the optical transmitting assembly and the optical receiving assembly to the main circuit board.

2. The optical module of claim 1, wherein the optical transmitting assembly further comprises at least one transmitting-end substrate, the at least two sets of lasers being disposed on the transmitting-end substrate, and the transmitting-end substrate being thermally connected to the housing.

3. The optical module of claim 2, wherein the transmitting-end substrate and the transmitting-end optical fiber receptacle are fixed together.

4. The optical module of claim 2, wherein there are only two sets of lasers,
   the optical transmitting assembly comprises two transmitting-end substrates, and
   the two sets of lasers are disposed on the two transmitting-end substrates, respectively.

5. The optical module of claim 4, wherein the housing comprises an upper housing and a lower housing, and the two transmitting-end substrates are a first transmitting-end substrate and a second transmitting-end substrate, respectively,
   one surface of the first transmitting-end substrate is thermally connected to the upper housing, and one set of lasers of the two sets of lasers is fixed on the other surface of the first transmitting-end substrate, and
   one surface of the second transmitting-end substrate is thermally connected to the lower housing, and the other set of lasers of the two sets of lasers is fixed on the other surface of the second transmitting-end substrate.

6. The optical module of claim 2, wherein the receiving-end substrate and the receiving-end optical fiber receptacle are fixed together.

7. The optical module of claim 1, wherein the optical receiving assembly further comprises at least one receiving-end substrate, the at least two sets of photoelectric detectors being disposed on the receiving-end substrate, and the receiving-end substrate being thermally connected to the housing.

8. The optical module of claim 7, wherein there are only two sets of photoelectric detectors,
   the optical receiving assembly comprises one receiving-end substrate, the receiving-end substrate being located on a plane parallel to the plane on which the main circuit board is located, and the two sets of photoelectric detectors being disposed on the two opposing surfaces of the receiving-end substrate, respectively.

9. The optical module of claim 1, wherein the optical transmitting assembly further comprises a transmitting-end fixing board enclosing the at least two sets of lasers and the transmitting-end optical assembly, the transmitting-end fixing board being fixed to the transmitting-end substrates and the transmitting-end optical fiber receptacle, and
   the optical receiving assembly further comprises a receiving-end fixing board enclosing the at least two sets of photoelectric detectors and the receiving-end optical assembly, the receiving-end fixing board being fixed to the receiving-end substrate and the receiving-end optical fiber receptacle.

10. The optical module of claim 1, wherein the electrical connector comprises at least one flexible circuit board.

11. The optical module of claim 10, wherein there are two flexible circuit boards, the optical transmitting assembly being electrically connected to the main circuit board by means of the two flexible circuit boards.

12. The optical module of claim 11, wherein the electrical connector further comprises a rigid connecting board, each one of the two flexible connecting boards including a first end on the side of the optical transmitting assembly and a second end, the first ends of the two flexible circuit boards being connected to two opposing surfaces of the rigid connecting board, respectively, and the second ends of the two flexible circuit boards being connected to two opposing surfaces of the main circuit board, respectively.

13. The optical module of claim 10, wherein the quantity of the at least one flexible circuit boards is two, the optical receiving assembly being electrically connected to the main circuit board by means of the two flexible circuit boards.

14. The optical module of claim 13, wherein the electrical connector further comprises a rigid connecting board, each one of the two flexible connecting boards including a first end on the side of the optical receiving assembly and a second end, the first ends of the two flexible circuit boards being connected to two opposing surfaces of the rigid connecting board, respectively, and the second ends of the two flexible circuit boards being connected to two opposing surfaces of the main circuit board, respectively.

15. An optical module, comprising:

a housing; and a main circuit board, an optical transmitting assembly, an optical receiving assembly, and an electrical connector that are disposed inside the housing, wherein the optical transmitting assembly comprises at least two sets of lasers, a transmitting-end substrate, a transmitting-end optical assembly, and a transmitting-end optical fiber receptacle, the at least two sets of lasers being disposed on the transmitting-end substrate, the transmitting-end substrate being thermally connected to the housing, the transmitting-end optical assembly orienting light emitted from the at least two sets of lasers toward the transmitting-end optical fiber receptacle, and the transmitting-end substrate and the transmitting-end optical fiber receptacle being fixed together;

the optical receiving assembly comprises at least two sets of photoelectric detectors, a receiving-end substrate, a receiving-end optical assembly, and a receiving-end optical fiber receptacle, the at least two sets of photoelectric detectors being disposed on the receiving-end substrate, the at least two sets of photoelectric detectors being stacked one above another in a direction perpendicular to a plane on which the main circuit board is located, the receiving-end optical assembly orienting light from the receiving-end optical fiber receptacle toward the at least two sets of photoelectric detectors, and the receiving-end substrate and the receiving-end optical fiber receptacle being fixed together; and the electrical connector electrically connects the optical transmitting assembly and optical receiving assembly to the main circuit board.

16. The optical module of claim 15, wherein the optical transmitting assembly further comprises a transmitting-end fixing board enclosing the at least two sets of lasers and transmitting-end optical assembly, the transmitting-end fixing board being fixed to the transmitting-end substrates and the transmitting-end optical fiber receptacle.

17. The optical module of claim 16, wherein the optical transmitting assembly is connected to the housing by means of thermally conductive adhesive or a thermally conductive pad.

18. The optical module of claim 15, wherein the optical receiving assembly further comprises a receiving-end fixing board enclosing the at least two sets of photoelectric detectors and receiving-end optical assembly, the receiving-end fixing board being fixed to the receiving-end substrate and the receiving-end optical fiber receptacle.

19. The optical module of claim 18, wherein the optical receiving assembly is connected to the housing by means of thermally conductive adhesive or a thermally conductive pad.

20. The optical module of claim 15, wherein the optical transmitting assembly and the optical receiving assembly are fixed together by means of a click-fit connector.

* * * * *